US012696807B2

(12) United States Patent
Nad et al.

(10) Patent No.: US 12,696,807 B2
(45) Date of Patent: Jul. 28, 2026

(54) ARCHITECTURES FOR BACKSIDE POWER DELIVERY WITH STACKED INTEGRATED CIRCUIT DEVICES

(71) Applicant: Intel Corporation, Santa Clara, CA (US)

(72) Inventors: Suddhasattwa Nad, Chandler, AZ (US); Srinivas Pietambaram, Chandler, AZ (US); Brandon Marin, Gilbert, AZ (US); Jeremy Ecton, Gilbert, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/089,459

(22) Filed: Dec. 27, 2022

(65) Prior Publication Data

US 2024/0213235 A1     Jun. 27, 2024

(51) Int. Cl.
*H10W 90/00*          (2026.01)
*H10W 72/00*          (2026.01)
*H10W 80/00*          (2026.01)
*H10W 90/20*          (2026.01)

(52) U.S. Cl.
CPC .......... *H10W 90/00* (2026.01); *H10W 72/823* (2026.01); *H10W 80/312* (2026.01); *H10W 80/327* (2026.01); *H10W 90/288* (2026.01); *H10W 90/291* (2026.01); *H10W 90/792* (2026.01)

(58) Field of Classification Search
CPC . H10W 90/00; H10W 72/823; H10W 80/312; H10W 80/327; H10W 90/288; H10W 90/291; H10W 90/792; H10W 99/00; H10W 72/20; H10W 72/90
See application file for complete search history.

(56) References Cited

U.S. PATENT DOCUMENTS 6,770,955  B1 *  8/2004  Coccioli  .............. H01Q 1/2283
                                                    257/784
7,265,442  B2 *  9/2007  Henttonen  ............ H10W 90/00
                                                    438/109
7,667,313  B2 *  2/2010  Kawabata  ............. H10W 90/00
                                                    257/777
8,685,792  B2 *  4/2014  Chow  ................... H10W 90/00
                                                    438/109
9,312,218  B2 *  4/2016  Choi  ................... H10W 70/635
9,601,461  B2 *  3/2017  Ho  ...................... H10W 70/614
9,728,481  B2 *  8/2017  Yee  ..................... H10W 40/10
                        (Continued)

*Primary Examiner* — John P. Dulka

(74) *Attorney, Agent, or Firm* — Essential Patents Group, LLP

(57)          ABSTRACT

An apparatus is provided which comprises: an integrated circuit logic device, an integrated circuit power device conductively coupled with a first surface of the integrated circuit logic device, wherein the integrated circuit power device extends laterally beyond a side of the integrated circuit logic device, one or more vias adjacent the side of the integrated circuit logic device extending from contact with the integrated circuit power device to level with a second surface of the integrated circuit logic device opposite the first surface of the integrated circuit logic device, and conductive contacts on the second surface of the integrated circuit logic device. Other embodiments are also disclosed and claimed.

20 Claims, 10 Drawing Sheets

350

(56)  References Cited

U.S. PATENT DOCUMENTS

| | | | | |
|---|---|---|---|---|
| 10,163,798 | B1 * | 12/2018 | Alur | H10W 70/05 |
| 11,469,206 | B2 * | 10/2022 | Elsherbini | H10W 90/00 |
| 11,676,941 | B2 * | 6/2023 | Hiner | H10W 74/01 |
| | | | | 257/737 |
| 11,798,865 | B2 * | 10/2023 | Mahajan | H10W 20/20 |
| 11,901,349 | B2 * | 2/2024 | Hung | H10W 90/00 |
| 12,166,026 | B2 * | 12/2024 | Hung | H10W 90/00 |
| 12,237,300 | B2 * | 2/2025 | Leuten | H10W 74/012 |
| 2004/0113253 | A1 * | 6/2004 | Karnezos | H10W 90/00 |
| | | | | 257/E25.023 |
| 2006/0175696 | A1 * | 8/2006 | Kim | H10W 70/68 |
| | | | | 257/E25.023 |
| 2006/0208358 | A1 * | 9/2006 | Henttonen | H10W 90/00 |
| | | | | 257/E25.023 |
| 2010/0194470 | A1 * | 8/2010 | Monchiero | H03K 19/0016 |
| | | | | 327/566 |
| 2011/0304999 | A1 * | 12/2011 | Yu | H10W 20/023 |
| | | | | 29/829 |
| 2012/0018885 | A1 * | 1/2012 | Lee | H10W 20/20 |
| | | | | 257/738 |
| 2012/0104623 | A1 * | 5/2012 | Pagaila | H10W 74/117 |
| | | | | 257/E21.503 |
| 2013/0058067 | A1 * | 3/2013 | Yee | H10W 40/10 |
| | | | | 361/820 |
| 2013/0075923 | A1 * | 3/2013 | Park | H10W 74/117 |
| | | | | 257/774 |
| 2017/0062383 | A1 * | 3/2017 | Yee | H10W 90/00 |
| 2017/0207197 | A1 * | 7/2017 | Yu | H10W 90/00 |
| 2018/0102311 | A1 * | 4/2018 | Shih | H10W 70/611 |
| 2018/0358298 | A1 * | 12/2018 | Zhai | H10W 70/09 |
| 2020/0105715 | A1 * | 4/2020 | Jang | H10P 72/7402 |
| 2020/0286814 | A1 * | 9/2020 | Mahajan | H10W 20/20 |
| 2021/0020605 | A1 * | 1/2021 | Hiner | H10W 74/01 |
| 2022/0148988 | A1 * | 5/2022 | Gu | H10W 72/90 |
| 2022/0238402 | A1 * | 7/2022 | Modi | H10W 70/68 |
| 2022/0344249 | A1 * | 10/2022 | Xie | H10W 90/00 |
| 2022/0367435 | A1 * | 11/2022 | Hung | H10W 90/00 |
| 2023/0095063 | A1 * | 3/2023 | Choi | G05F 1/44 |
| | | | | 323/282 |
| 2023/0163098 | A1 * | 5/2023 | Elsherbini | H10W 90/00 |
| | | | | 257/532 |
| 2023/0187407 | A1 * | 6/2023 | Molnar | H10W 90/00 |
| | | | | 257/777 |
| 2024/0063132 | A1 * | 2/2024 | Elsherbini | H10W 70/65 |
| 2024/0063202 | A1 * | 2/2024 | Elsherbini | H10D 1/716 |
| 2024/0071938 | A1 * | 2/2024 | Ecton | H10W 70/635 |
| 2024/0079335 | A1 * | 3/2024 | Ecton | H10W 70/65 |
| 2024/0113087 | A1 * | 4/2024 | Marin | H10W 70/68 |
| 2024/0120305 | A1 * | 4/2024 | Ecton | H10W 70/685 |
| 2024/0213235 | A1 * | 6/2024 | Nad | H10W 90/00 |
| 2024/0222279 | A1 * | 7/2024 | Ecton | H10W 70/65 |
| 2025/0006695 | A1 * | 1/2025 | Krishnatreya | H10W 20/20 |
| 2025/0046682 | A1 * | 2/2025 | Munding | H10W 40/255 |
| 2025/0062285 | A1 * | 2/2025 | Li | H10W 70/09 |
| 2025/0112161 | A1 * | 4/2025 | Liu | H10W 70/65 |
| 2025/0218962 | A1 * | 7/2025 | Mohammadighaleni | H10W 70/65 |
| 2025/0218982 | A1 * | 7/2025 | Nad | H10W 44/601 |
| 2025/0266395 | A1 * | 8/2025 | Ecton | H10W 42/121 |
| 2025/0300086 | A1 * | 9/2025 | Ecton | H10W 70/65 |
| 2025/0300144 | A1 * | 9/2025 | Li | H10W 70/611 |

* cited by examiner

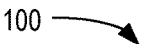
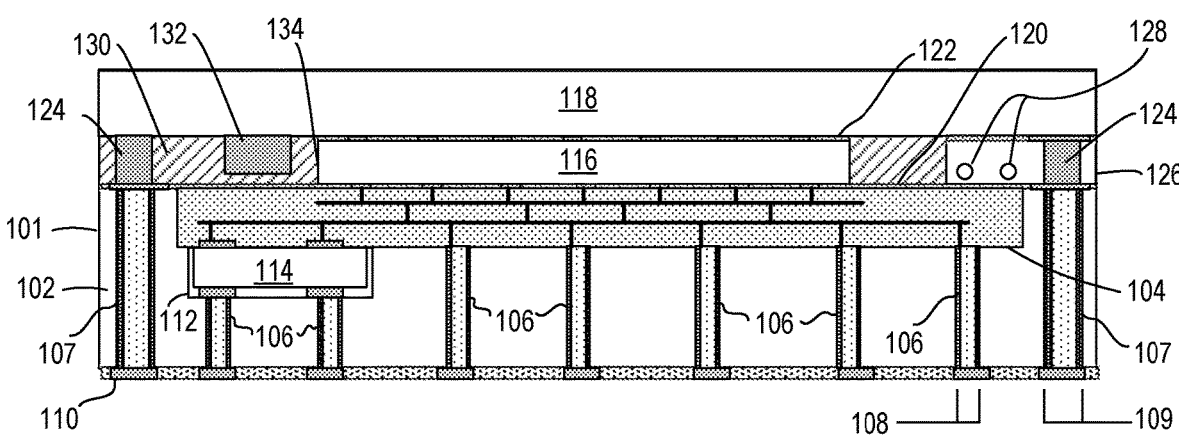
Fig. 1

200

206

202

204

210

214

212

202

206

204

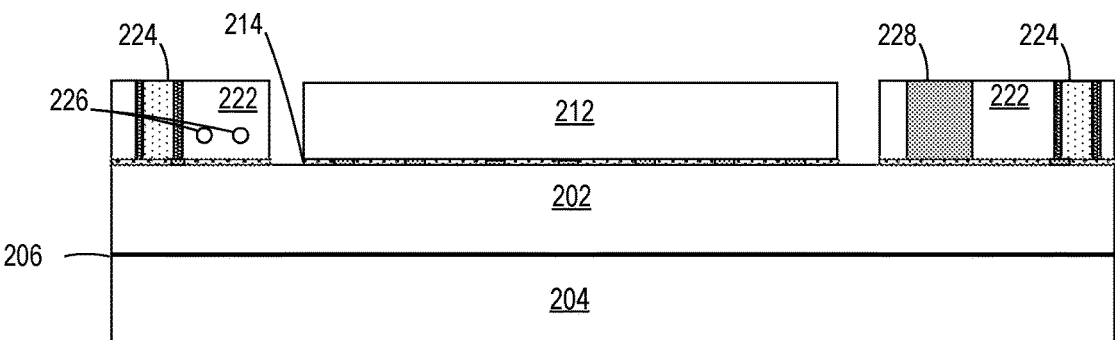
Fig. 2C
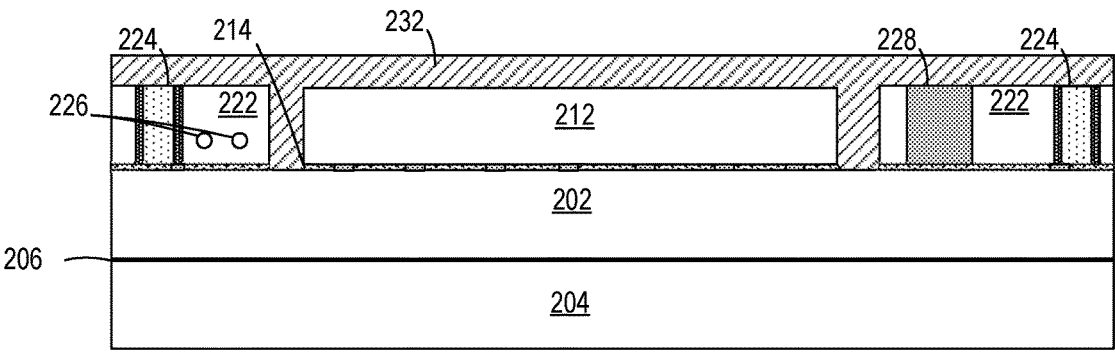
Fig. 2D

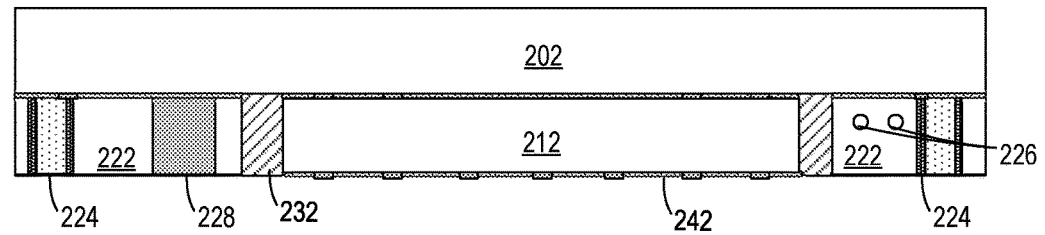
Fig. 2E
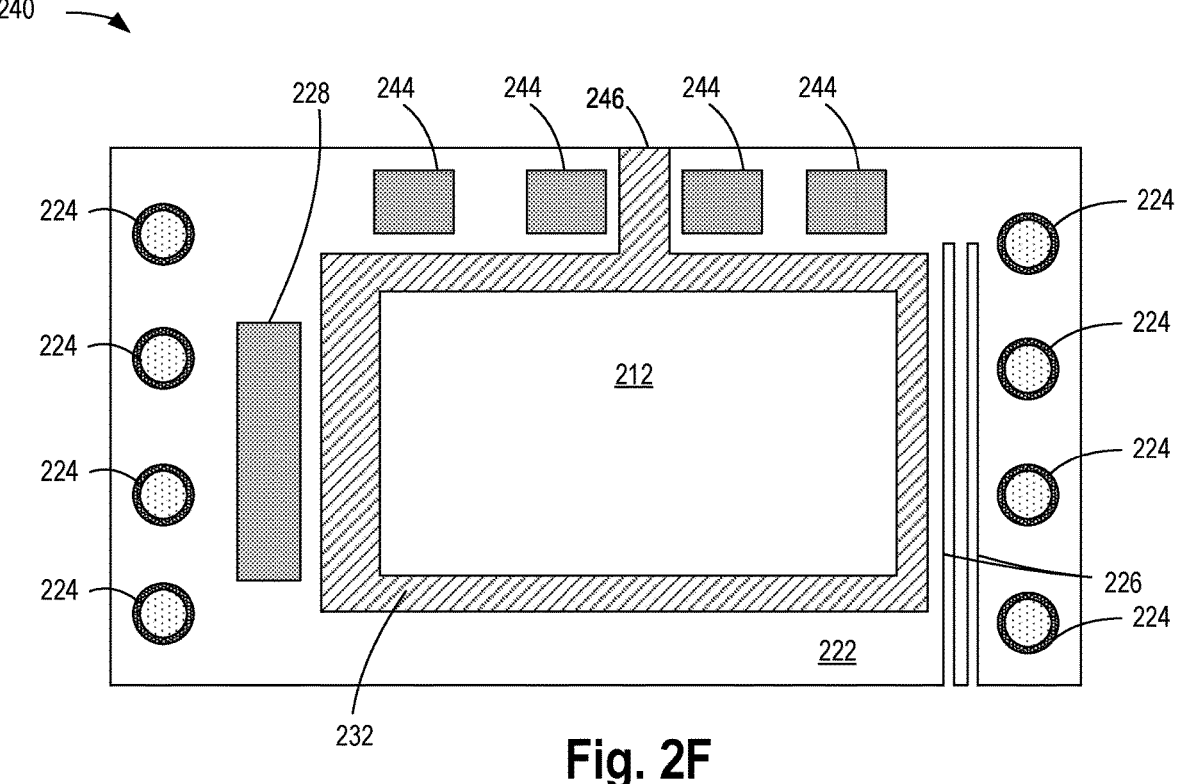
Fig. 2F

300

310

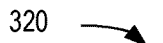
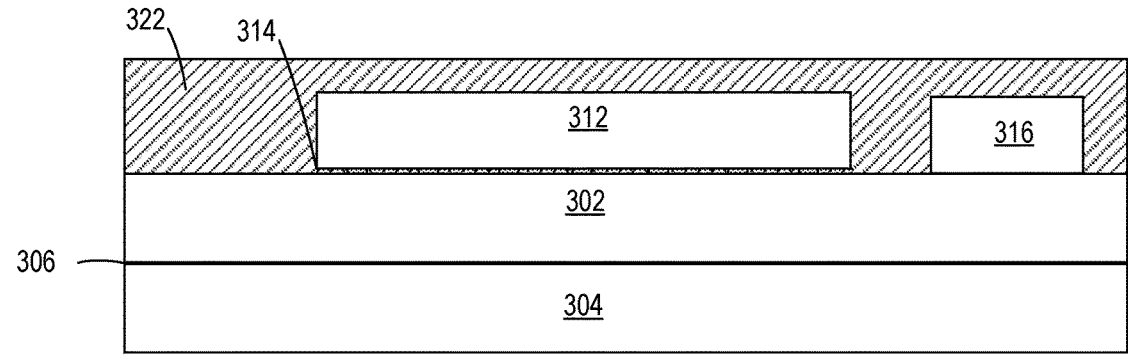
Fig. 3C
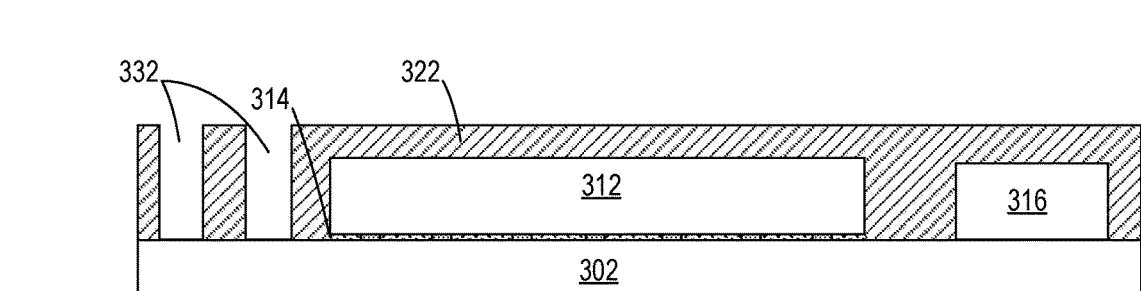
Fig. 3D

Figure 5:
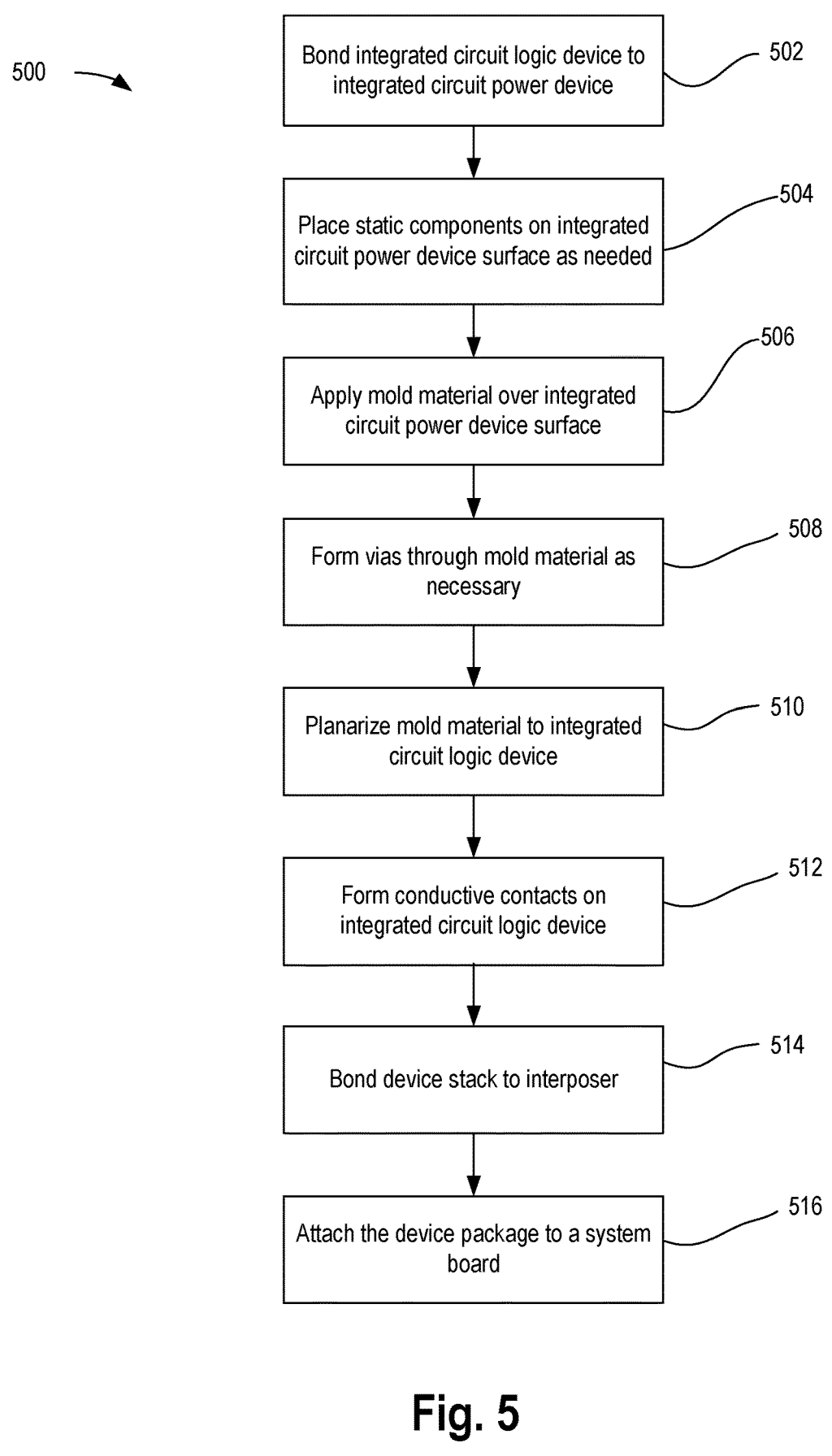

500

```
┌─────────────────────────────┐
│ Bond integrated circuit      │──── 502
│ logic device to              │
│ integrated circuit power     │
│ device                       │
└─────────────────────────────┘
              │
              ▼
┌─────────────────────────────┐
│ Place static components on   │──── 504
│ integrated circuit power     │
│ device surface as needed     │
└─────────────────────────────┘
              │
              ▼
┌─────────────────────────────┐
│ Apply mold material over     │──── 506
│ integrated circuit power     │
│ device surface               │
└─────────────────────────────┘
              │
              ▼
┌─────────────────────────────┐
│ Form vias through mold       │──── 508
│ material as necessary        │
└─────────────────────────────┘
              │
              ▼
┌─────────────────────────────┐
│ Planarize mold material to   │──── 510
│ integrated circuit logic     │
│ device                       │
└─────────────────────────────┘
              │
              ▼
┌─────────────────────────────┐
│ Form conductive contacts on  │──── 512
│ integrated circuit logic     │
│ device                       │
└─────────────────────────────┘
              │
              ▼
┌─────────────────────────────┐
│ Bond device stack to         │──── 514
│ interposer                   │
└─────────────────────────────┘
              │
              ▼
┌─────────────────────────────┐
│ Attach the device package to │──── 516
│ a system board               │
└─────────────────────────────┘
```

ARCHITECTURES FOR BACKSIDE POWER DELIVERY WITH STACKED INTEGRATED CIRCUIT DEVICES

BACKGROUND

Computing platforms, such as desktops, laptops or smart phones, for example, are expected to have increased performance compared with previous iterations. One way that manufacturers of computing platforms can achieve increased performance is by integrating more integrated circuit devices into a single package. Heterogeneous integration refers to the integration of separately manufactured components into an assembly that, in the aggregate, provides enhanced functionality and improved operating characteristics. As more computing cores are integrated into a package, or system on a chip, there arises a need to integrate more memory components into the package as well. With increased integration, there can arise issues with warpage, power delivery, and thermal management within device packages. Therefore, there is a need for high performance architectures that address these issues.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates a cross-sectional view of an example architecture for backside power delivery with stacked integrated circuit devices, according to some embodiments, FIGS. 2A-2F illustrate views of example manufacturing steps of forming an architecture for backside power delivery with stacked integrated circuit devices, according to some embodiments, FIGS. 3A-3F illustrate cross-sectional views of example manufacturing steps of forming an architecture for backside power delivery with stacked integrated circuit devices, according to some embodiments, FIG. 5 illustrates a flowchart of a method of forming an architecture for backside power delivery with stacked integrated circuit devices, in accordance with some embodiments.

DETAILED DESCRIPTION

Figure 2A:
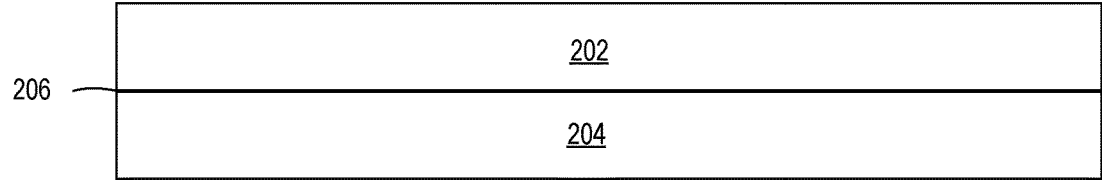

Architectures for backside power delivery with stacked integrated circuit devices are generally presented. In this regard, embodiments of the present disclosure enable power delivery to an opposite side of an integrated circuit logic device from signal interfaces. One skilled in the art would appreciate that this backside power delivery may enable more complex, higher power, highly integrated devices. Additionally, the architectures described herein may offer improved thermal management, power delivery, and reliability, and thereby enable enhanced features.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a cross-sectional view of an example architecture for backside power delivery with stacked integrated circuit devices, according to some embodiments. As shown, device package 100 includes interposer 101, glass core 102, redistribution layers 104, signal vias 106, power vias 107, signal via width 108, power via width 109, conductive contacts 110, interposer cavity 112, embedded device 114, integrated circuit logic device 116, integrated circuit power device 118, logic device bond 120, chip-to-chip bond 122, vias 124, glass frame 126, channels 128, mold material 130, copper slug 132, and logic device side 134. In some embodiments, device package 100 may include additional layers and integrate additional components.

In some embodiments, interposer 101 may include a glass core 102 for structural integrity and redistribution layers 104 for coupling with integrated circuit logic device 116. In some embodiments, glass core 102 may be a silicate (for example silicon dioxide-based) glass that may be tempered or treated. In some embodiments, glass core 102 is a non-crystalline amorphous solid. In some embodiments, glass core 102 may be designed to be thin and damage-resistant. In some embodiments, glass core 102 is pre-formed and not deposited in-situ using a traditional deposition technique, such as atomic layer deposition or chemical vapor deposition, for example. In some embodiments, glass core 102 is made by fusing liquid sand with soda ash (sodium carbonate), limestone (calcium carbonate), and/or other ingredients and cooling rapidly. In some embodiments, glass core 102 may contain boron oxide for improved thermal resistance. In some embodiments, glass core 102 may contain lead oxide for improved ease of cutting. In some embodiments, glass core 102 may contain a sandwich or laminate of multiple layers of glass that are plastic bonded together. In some embodiments, glass core 102 is transparent or translucent. In some embodiments, glass core 102 may have a thickness of between about 1 and 10 millimeters. Glass core 102 may have an inherently low surface roughness and a high temperature tolerance, allowing for uniform thin film depositions that require annealing. In some embodiments, glass core 102 may have a relatively low coefficient of thermal expansion (CTE). In some embodiments, glass core 102 may also contain ceramic material. In some embodiments, the thermal expansion of glass core 102 is controlled by firing to create crystalline species that will influence the overall expansion of glass core 102 in the desired direction. For example, glass core 102 may include crystalline additives that tend to thermally expand longitudinally, as opposed to laterally. In some embodiments, the formulation of glass core 102 employs materials delivering particles of the desired expansion to the matrix. In some embodiments, glass core 102 may include a glaze (not shown) that may have the effect of reducing thermal expansion.

Signal vias 106 and power vias 107 may be drilled through glass core 102 by any known method, including, for example, laser drilling and plating, to provide electrical pathways through glass core 102 to conductive contacts 110. Signal vias 106 and/or power vias 107 may also be lined and/or filled with additional dielectric material to provide electrical insulation. While signal vias 106 are also shown as being present between interposer cavity 112 and conductive contacts 110, signal vias 106 are not included there in some embodiments. In some embodiments, signals vias 106 may have a width 108 that is less than power via width 109. One skilled in the art may appreciate that this difference in via width may improve power delivery.

Interposer cavity 112, may be formed below a surface of glass core 102 by any known method, including, but not limited to, chemical or mechanical etching. While shown as extending down to a lower surface, in some embodiments, interposer cavity 112 may extend completely through glass core 102. Also, while shown as including a single interposer cavity 112, any number of interposer cavities may be incorporated with similar or varying depths.

In some embodiments, embedded device 114 represents an integrated circuit device. In some embodiments, embedded device 114 may be a memory device, such as a high bandwidth memory (HBM). In some embodiments, embedded device 114 may be an intelligent power device (IPD). In other embodiments, embedded device 114 may be a photonic integrated circuit (PIC) or an embedded passive component (EPC). While shown as being a single device, embedded device 114 may be implemented as a stack of multiple homogeneous or heterogeneous devices.

Redistribution layers 104 may be formed over embedded device 114 and upper interposer surface 104. In some embodiments, redistribution layers 104 may include multiple layers of interlayer dielectric, such as a doped silicon dioxide, for example, along with metal wires to route contacts of signal vias 106 and embedded device 114 to integrated circuit logic device 116. In some embodiments, redistribution layers 104 may fan-in a contact pitch from signal vias 106 to integrated circuit logic device 116. Logic device bond 120 may conductively couple integrated circuit logic device 116 with redistribution layers 104. In some embodiments, logic device bond 120 may be a solder joint bond or a hybrid bonded interconnect.

In some embodiments, integrated circuit power device 118 may provide power regulation and/or distribution to integrated circuit logic device 116. In some embodiments, integrated circuit power device 118 may receive power and ground through vias 124 and power vias 107 which may be regulated before being forwarded to integrated circuit logic device 116 via chip-to-chip bond 122. In some embodiments, integrated circuit power device 118 may also include memory or other components that also interface with integrated circuit logic device 116. Integrated circuit power device 118 may be bonded with integrated circuit logic device 116 through chip-to-chip bond 122. In some embodiments, chip-to-chip bond 122 may represent traditional solder bonding. In other embodiments, chip-to-chip bond 122 may represent hybrid bonding. In some embodiments, integrated circuit logic device 116 may represent one or more controllers, processors, or system-on-a-chip (SOCs), such as multi-core processors, for example.

In some embodiments, glass frame 126 may include channels 128. In some embodiments, channels 128 may be pathways through glass frame 126 through which fluid may be able to flow when incorporated with an active thermal solution, for example including tubing and pumps (not shown).

Mold material 130 may surround one or more sides of integrated circuit logic device 116. In some embodiments, mold material 130 is a highly thermally conductive epoxy mold, for example with filler material. In some embodiments, mold material 130 is formed to be coplanar with device stack surface 138. In some embodiments, copper slug 132 may be present against integrated circuit power device 118, surrounded by mold material 130, and adjacent logic device side 134 as part of a thermal management solution.

FIGS. 2A-2F illustrate views of example manufacturing steps of forming an architecture for backside power delivery with stacked integrated circuit devices, according to some embodiments. As shown in FIG. 2A, assembly 200 includes integrated circuit power device 202, carrier 204, and adhesive 206. In some embodiments, adhesive 206 may be a removable film that temporarily adheres integrated circuit power device 202 with carrier 204, which may be a glass carrier. In some embodiments, integrated circuit power device 202 may include circuitry to regulate an input voltage and distribute an output voltage.

Figure 2B:
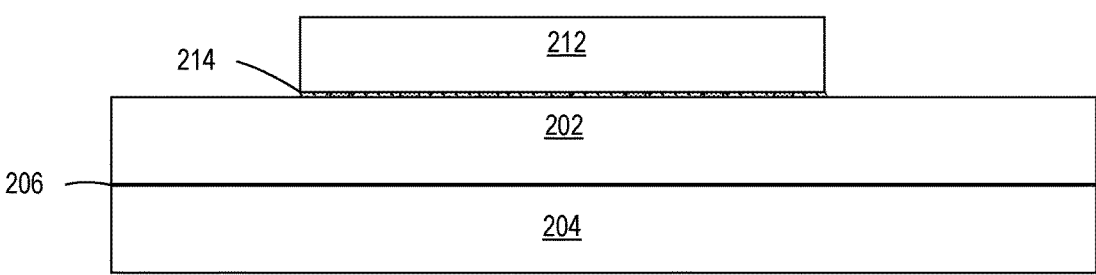

FIG. 2B shows assembly 210, which may include integrated circuit logic device 212 and chip-to-chip connection 214. In some embodiments, integrated circuit logic device 212 may be a multi-core processor. In some embodiments, chip-to-chip connection 214 between integrated circuit logic device 212 and integrated circuit power device 202 may include solder bonding or hybrid bonding.

As shown in FIG. 2C, assembly 220 may include glass frame 222, which may include vias 224, channels 226, or copper slug 228. In some embodiments, glass frame 222 may be bonded with integrated circuit power device 202 by solder bonding or hybrid bonding. In some embodiments, vias 224 may include conductive material, such as metal, with additional insulative material surrounding (and/or surrounded by) the conductive material. Vias 224 may be formed by laser drilling or any other known method. Channels 226 may be present in glass frame 222 through which fluid may be able to flow as part of an active thermal management solution. Copper slug 228 may be present in glass frame 222 to provide additional thermal conductivity as part of a thermal management solution. While shown as including both channels 226 and copper slug 228, in some embodiments only one of either of these thermal solutions would be present.

Turning now to FIG. 2D, assembly 230 may include mold material 232 over integrated circuit power device 202 and integrated circuit logic device 212. In some embodiments, mold material 232 is an epoxy resin with filler material, such as metallic or ceramic material, for example, to provide enhanced thermal conductivity.

FIG. 2E shows assembly 240, which may include conductive contacts 242 on integrated circuit logic device 212 after planarization of mold material 232. In some embodiments, mold material 232 may be planarized to expose a surface of integrated circuit logic device 212 by chemical or mechanical methods. Conductive contacts 242 may include discrete conductive contacts, such as copper, to enable coupling with another component, such as a package substrate or system board, for example.

As shown in FIG. 2F, in a plan view of assembly 240, glass frame 222 may surround four lateral sides of integrated circuit logic device 212, while in other embodiments, glass frame 222 may surround fewer lateral sides of integrated circuit logic device 212. For example, in some embodiments, glass frame 222 may be L-shaped, U-shaped, or I-shaped. In some embodiments, glass frame 222 may include multiple segmented copper slugs 244 as well as frame gaps 246. Mold material 232 may fill in any frame gaps 246 in glass frame 222. While shown as being present on opposite sides of glass frame 222, vias 224 may be present on any or all sides of glass frame 222. Also, while shown as being linearly arranged, vias 224 may be present in nonlinear arrangements.

Figure 3A:
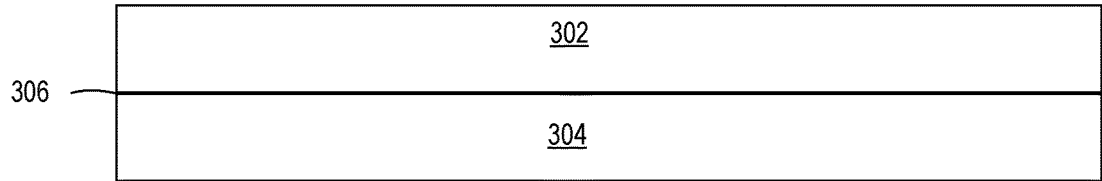

FIGS. 3A-3F illustrate cross-sectional views of example manufacturing steps of forming an architecture for backside power delivery with stacked integrated circuit devices, according to some embodiments. As shown in FIG. 3A, assembly 300 includes integrated circuit power device 302, carrier 304, and adhesive 306. In some embodiments, adhesive 306 may be a removable film that temporarily adheres integrated circuit power device 302 with carrier 304, which may be a glass carrier. In some embodiments, integrated circuit power device 302 may include circuitry to regulate an input voltage and distribute an output voltage.

Figure 3B:
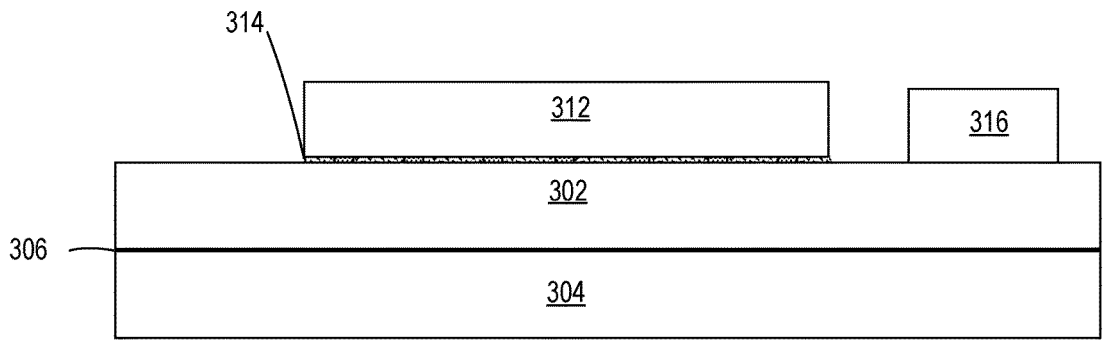

FIG. 3B shows assembly 310, which may include integrated circuit logic device 312, chip-to-chip connection 314, and copper slug 316. In some embodiments, integrated circuit logic device 312 may be a multi-core processor. In some embodiments, chip-to-chip connection 314 between integrated circuit logic device 312 and integrated circuit power device 302 may include solder bonding or hybrid bonding. In some embodiments, copper slug 316 may be placed in contact with integrated circuit power device 302 to provide enhanced heat dissipation as part of a thermal management solution.

As shown in FIG. 3C, assembly 320 may include mold material 322. In some embodiments, mold material 322 is an epoxy resin with filler material, such as metallic or ceramic material, for example, to provide enhanced thermal conductivity.

Turning now to FIG. 3D, assembly 330 may include openings 332 formed in mold material 332 exposing surfaces of integrated circuit power device 302. In some embodiments, openings 332 are formed by laser or chemical etching or ablation.

Figure 3E:
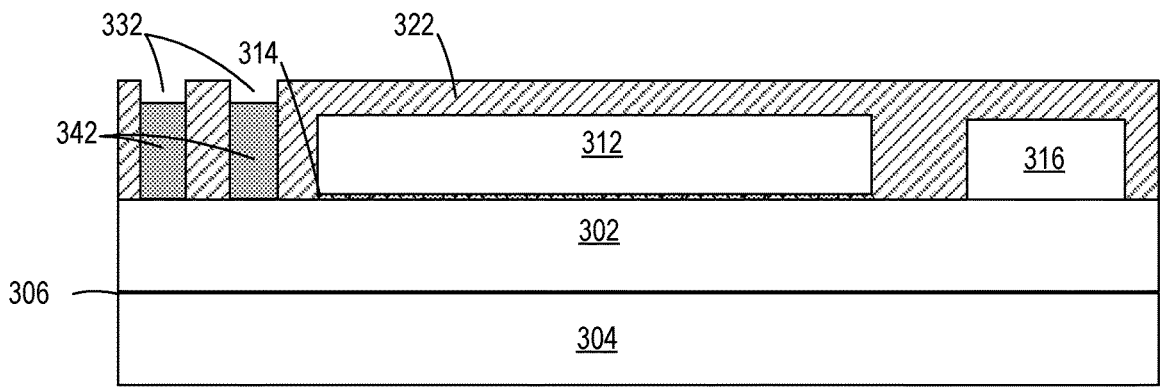

FIG. 3E shows assembly 340, which may include metal 342 deposited in openings 332. In some embodiments, metal 342 may be copper deposited by electroplating. In some embodiments, metal 342 may extend above a height of integrated circuit logic device 312.

Figure 3F:
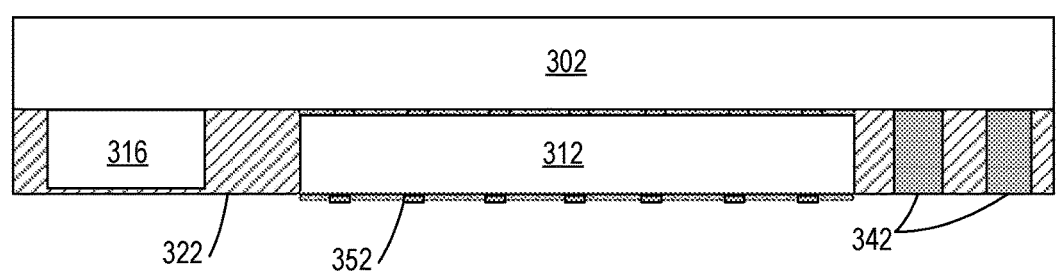

As shown in FIG. 3F, assembly 350 may include conductive contacts 352 on integrated circuit logic device 312 after planarization of mold material 322. In some embodiments, mold material 322 may be planarized to expose a surface of integrated circuit logic device 312 by chemical or mechanical methods. Conductive contacts 252 may include discrete conductive contacts, such as copper, to enable coupling with another component, such as a package substrate or system board, for example.

Figure 4:
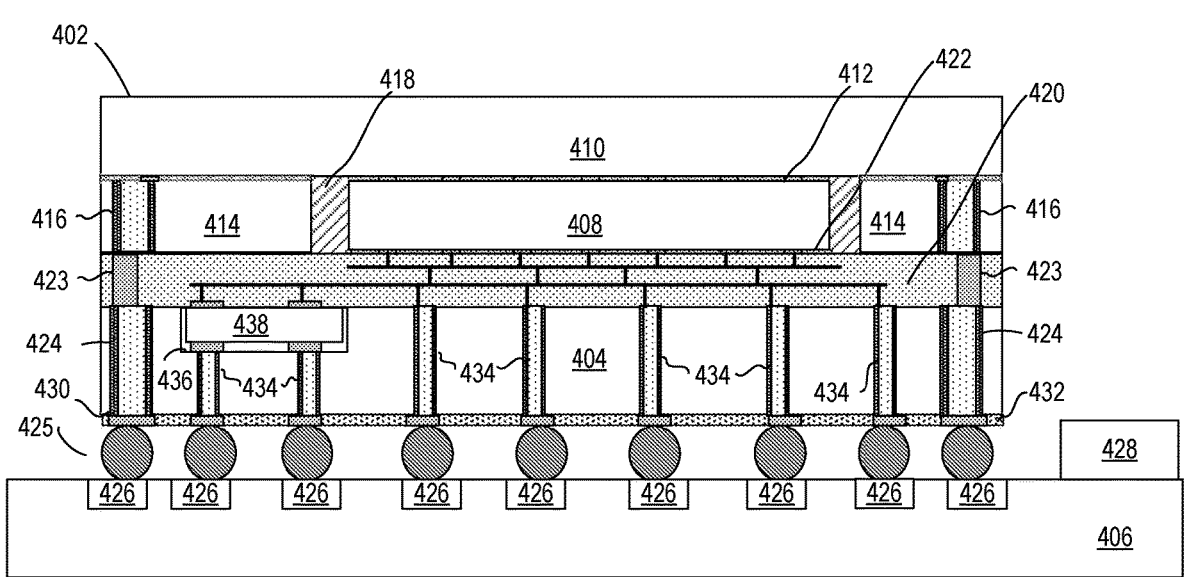
FIG. 4 illustrates a cross-sectional view of an example architecture for backside power delivery with stacked integrated circuit devices, according to some embodiments.

FIG. 4 illustrates a cross-sectional view of an example architecture for backside power delivery with stacked integrated circuit devices, according to some embodiments. As shown, assembly 400 includes device package 402, interposer core 404, system board 406, integrated circuit logic device 408, integrated circuit power device 410, chip-to-chip bond 412, glass frame 414, frame vias 416, mold material 418, redistribution layers 420, logic device interconnect 422, redistribution layer vias 423, power vias 424, solder balls 425, board pads 426, board component 428, package surface 430, package contacts 432, signal vias 434, interposer cavity 436, and embedded device 438.

Device package 402 may incorporate elements previously discussed in reference to prior FIGURES. For example, elements of device package 402 may have properties discussed in reference to FIG. 1, 2A-2F, or 3A-3F. As shown, device package 402 may include glass frame 414 with pre-formed vias 416 to route power and ground to integrated circuit power device 410. In this example embodiment, glass frame 414 is bonded with integrated circuit power device 410 and, at least partially, surrounds multiple sides of integrated circuit logic device 408. In some embodiments, device package 402 may include additional routing or interconnect layers, for example above or below interposer core 404, or other components or features, not shown herein.

In some embodiments, solder balls 425 may be formed on bottom surface contacts 314, thereby allowing device package 402 to be soldered to system board 406 through board pads 426. System board 406 may also incorporate board component 428, which may represent any type of active or passive system components, such as a power supply, memory devices, voltage regulators, I/O interfaces, etc.

FIG. 5 illustrates a flowchart of a method of forming an architecture for backside power delivery with stacked integrated circuit devices, in accordance with some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 500 begins with bonding (502) an integrated circuit logic device to an integrated circuit power device. In some embodiments, such as assembly 210, integrated circuit logic device 212 may be bonded with integrated circuit power device 202 with chip-to-chip bond 214. Next, static components may be placed (504) on a surface of the integrated circuit power device. In some embodiments, such as assembly 220, glass frame 222 containing pre-formed vias 224 may be placed on integrated circuit power device 202. In some embodiments, such as assembly 310, copper slug 316 may be place on integrated circuit power device 302.

Then, a mold material may be applied (506) over the integrated circuit power device surface. In some embodiments, such as assembly 230, mold material 232 may be applied over integrated circuit power device 202 and integrated circuit logic device 212. Next, vias may be formed (508) through the mold material. In some embodiments, such as assembly 340, metal 342 may be formed in cavities 332 through mold material 322.

The method continues, in some embodiments, with planarizing (510) the mold material to the integrated circuit logic device. In some embodiments, such as assembly 240, mold material 232 may be planarized to expose a surface of integrated circuit logic device 212. Next, conductive contacts may be formed (512) on the integrated circuit logic device. In some embodiments, such as assembly 240, conductive contacts 242 may be formed on integrated circuit logic device 212.

Next, the device stack may be bonded (514) to an interposer. In some embodiments, such as device package 100, integrated circuit logic device 116 may be bonded with interposer 101. Finally, the device package may be attached (516) to a system board. In some embodiments, solder bumps, such as solder bumps 425 may be formed on device package 402, allowing device package 402 to be soldered to system board 406.

Figure 6:
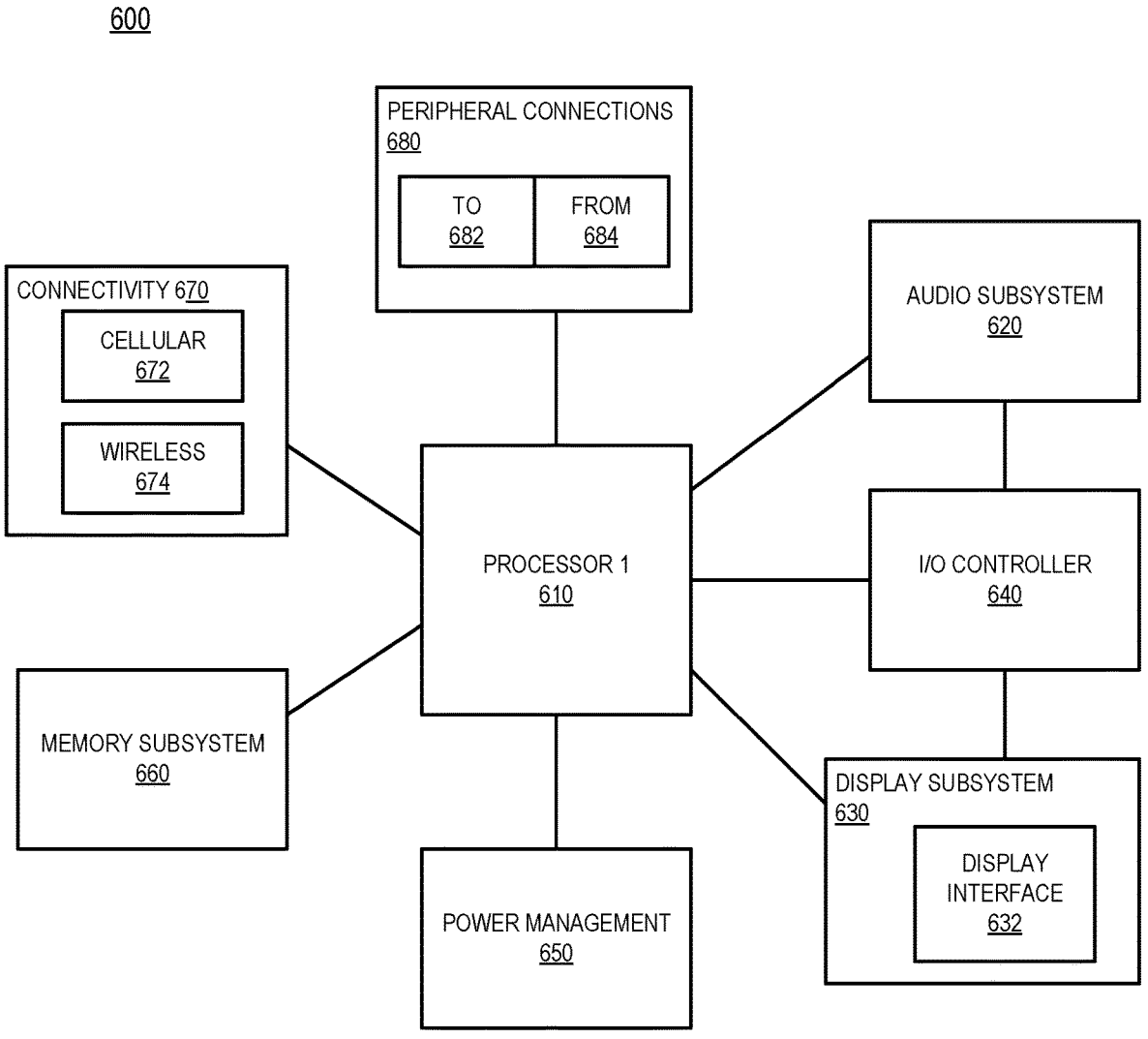
FIG. 6 illustrates a smart device or a computer system or a SoC (System-on-Chip) which includes an architecture for backside power delivery with stacked integrated circuit devices, according to some embodiments.

FIG. 6 illustrates a smart device or a computer system or a SoC (System-on-Chip) which includes an architecture for backside power delivery with stacked integrated circuit devices, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example processor 610 or I/O controller 640, include an architecture for backside power delivery with stacked integrated circuit devices as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BICMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMS, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented FIGURES, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:

an integrated circuit logic device;

an integrated circuit power device conductively coupled with a first surface of the integrated circuit logic device, wherein the integrated circuit power device extends laterally beyond a side of the integrated circuit logic device;

one or more vias adjacent the side of the integrated circuit logic device extending from contact with the integrated circuit power device to level with a second surface of the integrated circuit logic device opposite the first surface of the integrated circuit logic device; and conductive contacts on the second surface of the integrated circuit logic device.

2. The apparatus of claim 1, further comprising a glass frame adjacent the side of the integrated circuit logic device.

3. The apparatus of claim 2, wherein the glass frame further comprises channels through which liquid may flow.

4. The apparatus of claim 2, wherein the one more vias comprise through glass vias through the glass frame.

5. The apparatus of claim 2, wherein the glass frame is hybrid bonded with the integrated circuit power device.

6. The apparatus of claim 1, further comprising a copper slug adjacent the side of the integrated circuit logic device.

7. The apparatus of claim 1, further comprising mold material surrounding the one or more vias.

8. The apparatus of claim 1, further comprising an interposer coupled with the second surface of the integrated circuit logic device, wherein the interposer comprises an embedded integrated circuit device.

9. The apparatus of claim 8, wherein the embedded integrated circuit device comprises a device chosen from the group consisting of: high bandwidth memory (HBM), intelligent power device (IPD), photonic integrated circuit (PIC), and embedded passive components (EPC).

10. The apparatus of claim 9, wherein the interposer further comprises a first set of traces having a first diameter and a second set of traces having a second diameter, wherein the second diameter is greater than the first diameter and wherein the first traces are conductively coupled with the conductive contacts on the second surface of the integrated circuit logic device and wherein the second traces are conductively coupled with the one or more vias.

11. A system comprising:

a host board;

an integrated circuit device package, the integrated circuit device package comprising:

an integrated circuit logic device;

an integrated circuit power device conductively coupled with a first surface of the integrated circuit logic device, wherein the integrated circuit power device extends laterally beyond a side of the integrated circuit logic device;

one or more vias adjacent the side of the integrated circuit logic device extending from contact with the integrated circuit power device to level with a second surface of the integrated circuit logic device opposite the first surface of the integrated circuit logic device;

conductive contacts on the second surface of the integrated circuit logic device; and an interposer coupled with the second surface of the integrated circuit logic device; and a power supply to provide power to the integrated circuit device package through the host board.

12. The system of claim 11, wherein the integrated circuit logic device is hybrid bonded with the integrated circuit power device.

13. The system of claim 11, wherein the interposer further comprises an embedded integrated circuit device comprising a device chosen from the group consisting of: high bandwidth memory (HBM), intelligent power device (IPD), photonic integrated circuit (PIC), and embedded passive components (EPC).

14. The system of claim 11, wherein the interposer further comprises a first set of traces having a first diameter and a second set of traces having a second diameter, wherein the second diameter is greater than the first diameter and wherein the first traces are conductively coupled with the conductive contacts on the second surface of the integrated circuit logic device and wherein the second traces are conductively coupled with the one or more vias.

15. The system of claim 11, further comprising a frame surrounding at least the side of the integrated circuit logic device, the frame adjacent at least the side of the integrated circuit logic device.

16. A method comprising:

bonding a first surface of an integrated circuit logic device with an integrated circuit power device, wherein the integrated circuit power device extends laterally beyond a side of the integrated circuit logic device;

forming one or more vias adjacent the side of the integrated circuit logic device extending from contact with the integrated circuit power device to level with a second surface of the integrated circuit logic device opposite the first surface of the integrated circuit logic device;

applying mold material against the integrated circuit logic device; and forming conductive contacts on the second surface of the integrated circuit logic device.

17. The method of claim 16, wherein forming one or more vias comprises placing a glass frame comprising the one or more vias adjacent the side of the integrated circuit logic device.

18. The method of claim 16, wherein forming one or more vias comprises:

drilling one or more openings in mold material over the integrated circuit power device; and depositing metal in the openings.

19. The method of claim 16, further comprising coupling an interposer with the second surface of the integrated circuit logic device, wherein the interposer comprises an embedded integrated circuit device.

20. The method of claim 16, further comprising coupling a first set of interposer traces with the conductive contacts on the second surface of the integrated circuit logic device and coupling a second set of interposer traces with the one or more vias, wherein the first set of interposer traces have first diameter and the second set of interposer traces have a second diameter, wherein the second diameter is greater than the first diameter.

* * * * *